United States Patent
Lee et al.

(10) Patent No.: US 12,445,128 B2
(45) Date of Patent: Oct. 14, 2025

(54) SWITCHING CIRCUIT HAVING CONSTANT ON-RESISTANCE AND MATRIX SWITCH COMPRISING SAME

(71) Applicant: DANAM SYSTEMS INC., Anyang-si (KR)

(72) Inventors: Na Hyeok Lee, Anyang-si (KR); Seong Jong Kim, Siheung-si (KR); Yu Kwang Park, Yongin-si (KR); Chae Min Lim, Anyang-si (KR)

(73) Assignee: DANAM SYSTEMS INC., Anyang-si (KR)

( * ) Notice: Subject to any disclaimer, the term of this patent is extended or adjusted under 35 U.S.C. 154(b) by 0 days.

(21) Appl. No.: 18/556,882

(22) PCT Filed: Jun. 23, 2022

(86) PCT No.: PCT/KR2022/008932
§ 371 (c)(1),
(2) Date: Oct. 23, 2023

(87) PCT Pub. No.: WO2023/171855
PCT Pub. Date: Sep. 14, 2023

(65) Prior Publication Data
US 2024/0213980 A1 Jun. 27, 2024

(30) Foreign Application Priority Data
Mar. 7, 2022 (KR) .......... 10-2022-0028793

(51) Int. Cl.
*H03K 17/687* (2006.01)
*G01R 31/327* (2006.01)

(52) U.S. Cl.
CPC ....... *H03K 17/6874* (2013.01); *G01R 31/327* (2013.01)

(58) Field of Classification Search
CPC ............. H03K 17/687; H03K 17/6871; H03K 17/6874; H03K 17/06; H03K 17/14; H03K 17/162; H03K 17/693; H03K 17/56; H03K 17/16; G01R 31/327; G01R 31/32; G01R 31/2621; G01R 31/26; H01H 33/59; H01H 9/54
See application file for complete search history.

(56) References Cited

U.S. PATENT DOCUMENTS

| 11,228,308 B2 | 1/2022 | Chen et al. |
| 2018/0083618 A1* | 3/2018 | Sato ..................... H03K 17/162 |

FOREIGN PATENT DOCUMENTS

| JP | 2021166323 A | * 10/2021 | ............. H01H 33/59 |
| KR | 10-0614806 B1 | 8/2006 | |
| KR | 10-2016-0069754 A | 6/2016 | |
| KR | 10-1698480 B1 | 1/2017 | |

\* cited by examiner

*Primary Examiner* — Son T Le

(57) ABSTRACT

According to various exemplary embodiments of the present disclosure, a switching circuit is applied so as not to cause a problem due to body-diode and maintains a resistance (ON-resistance) between a drain region and a source region to be constant by adjusting a voltage of the gate region in accordance with the voltage change of the source region. Further, the matrix switch is applied so that even though the temperature changes in accordance with the switching circuit block (row/column), the change in the ON-resistance is small.

15 Claims, 13 Drawing Sheets

[FIG. 1]
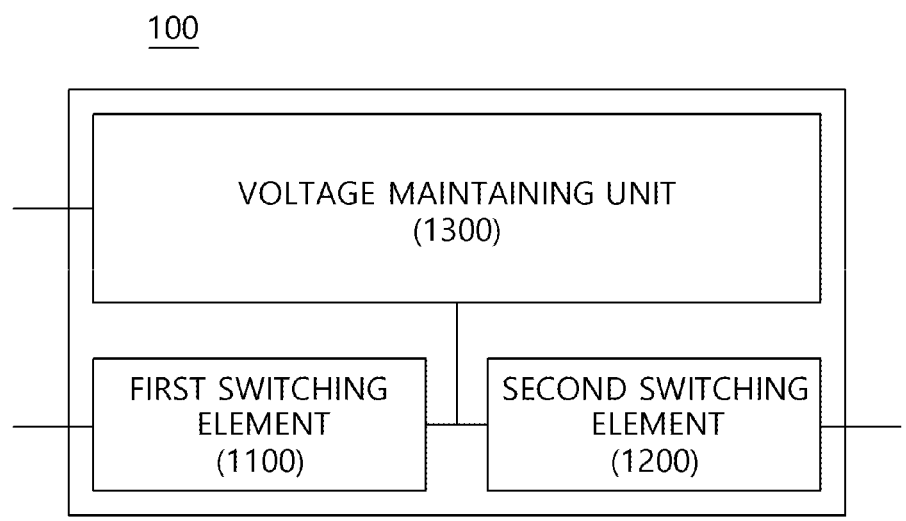

[FIG. 2]
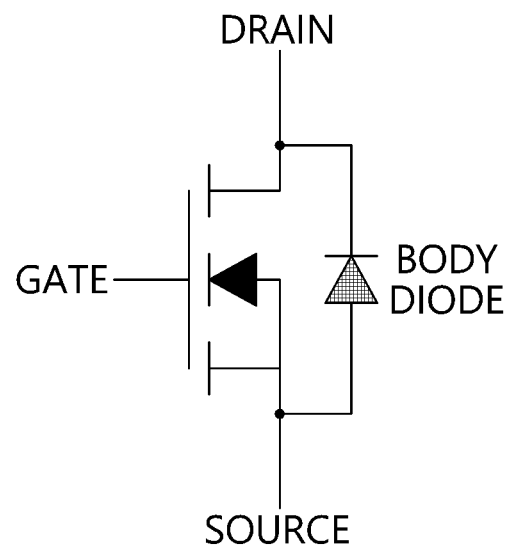

[FIG. 3]
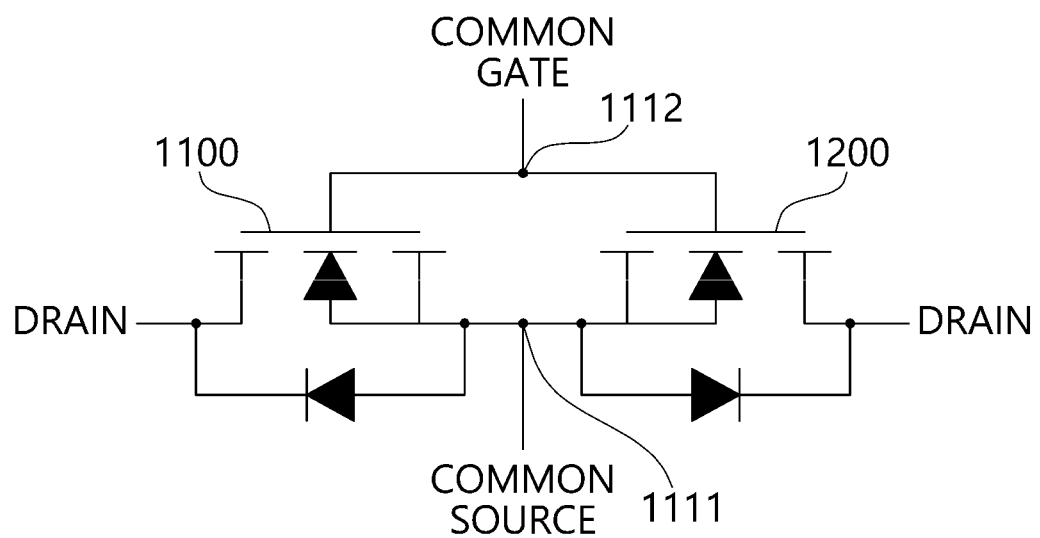

[FIG. 4]
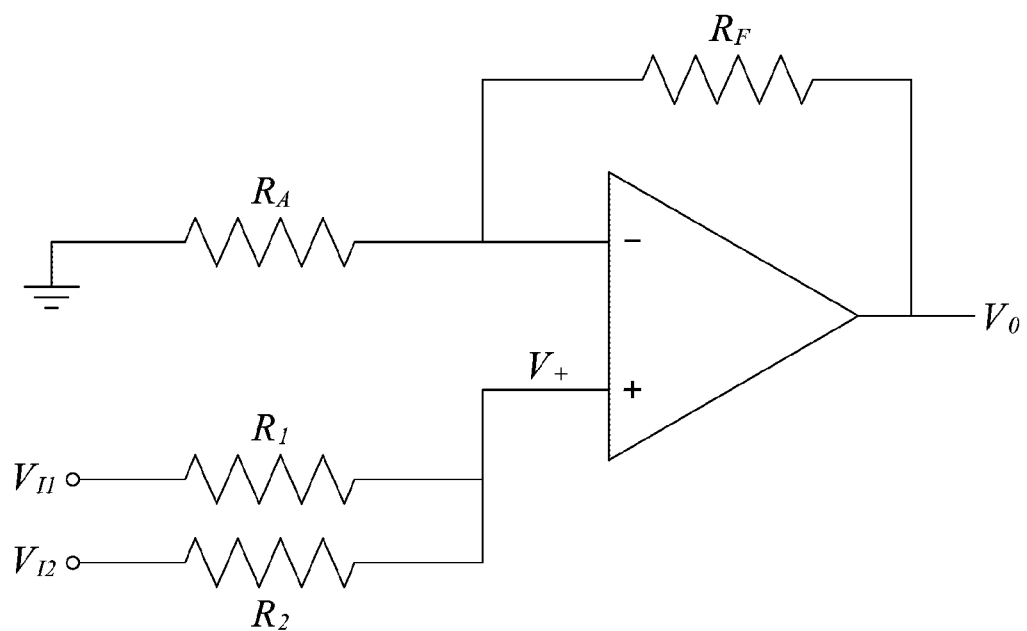

[FIG. 5]
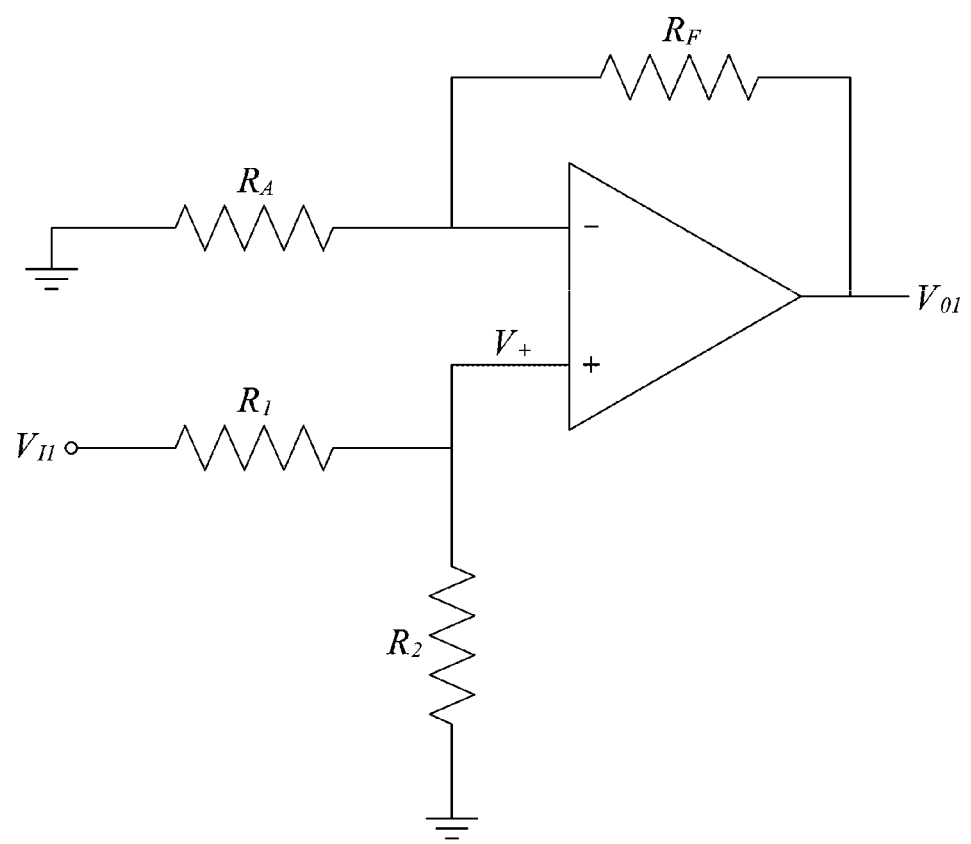

[FIG. 6]
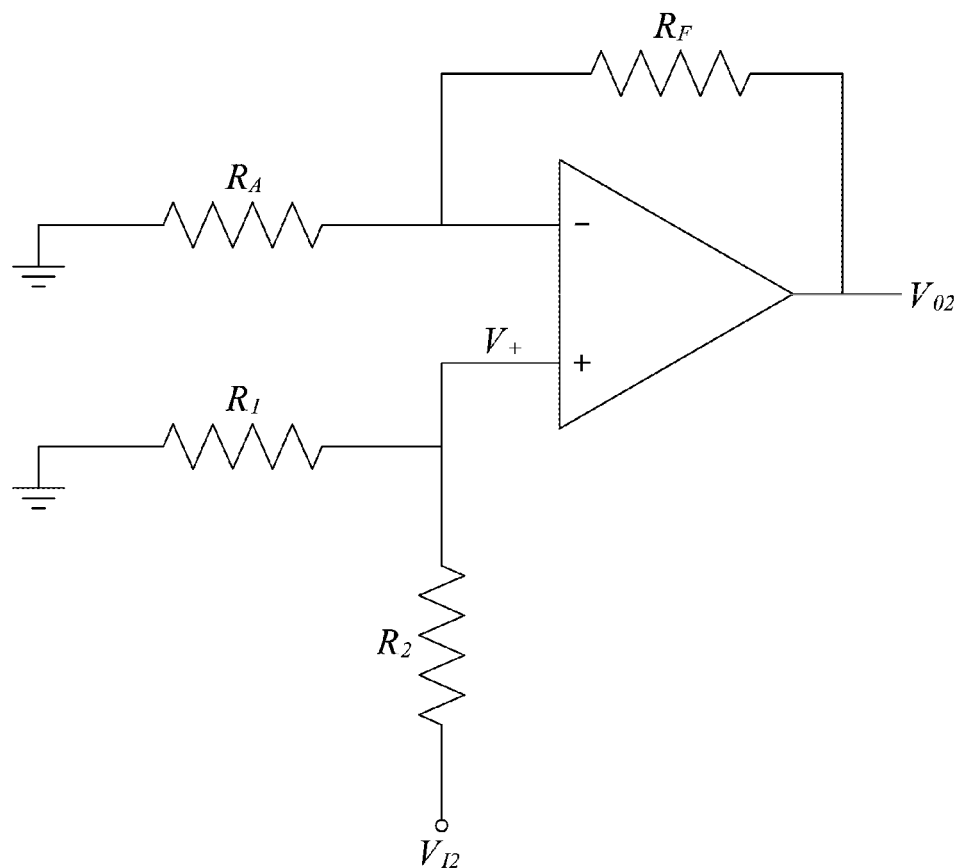

[FIG. 7]
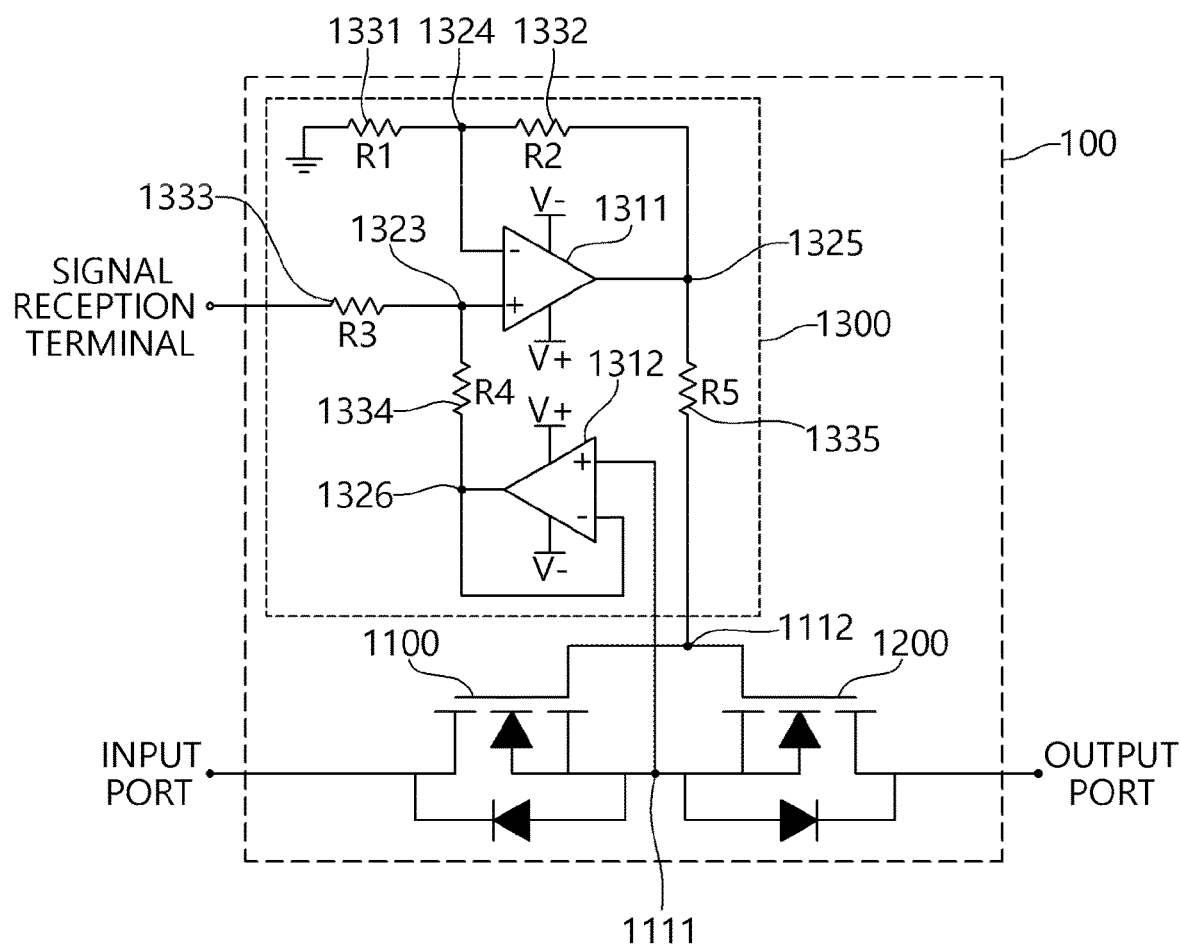

[FIG. 8]
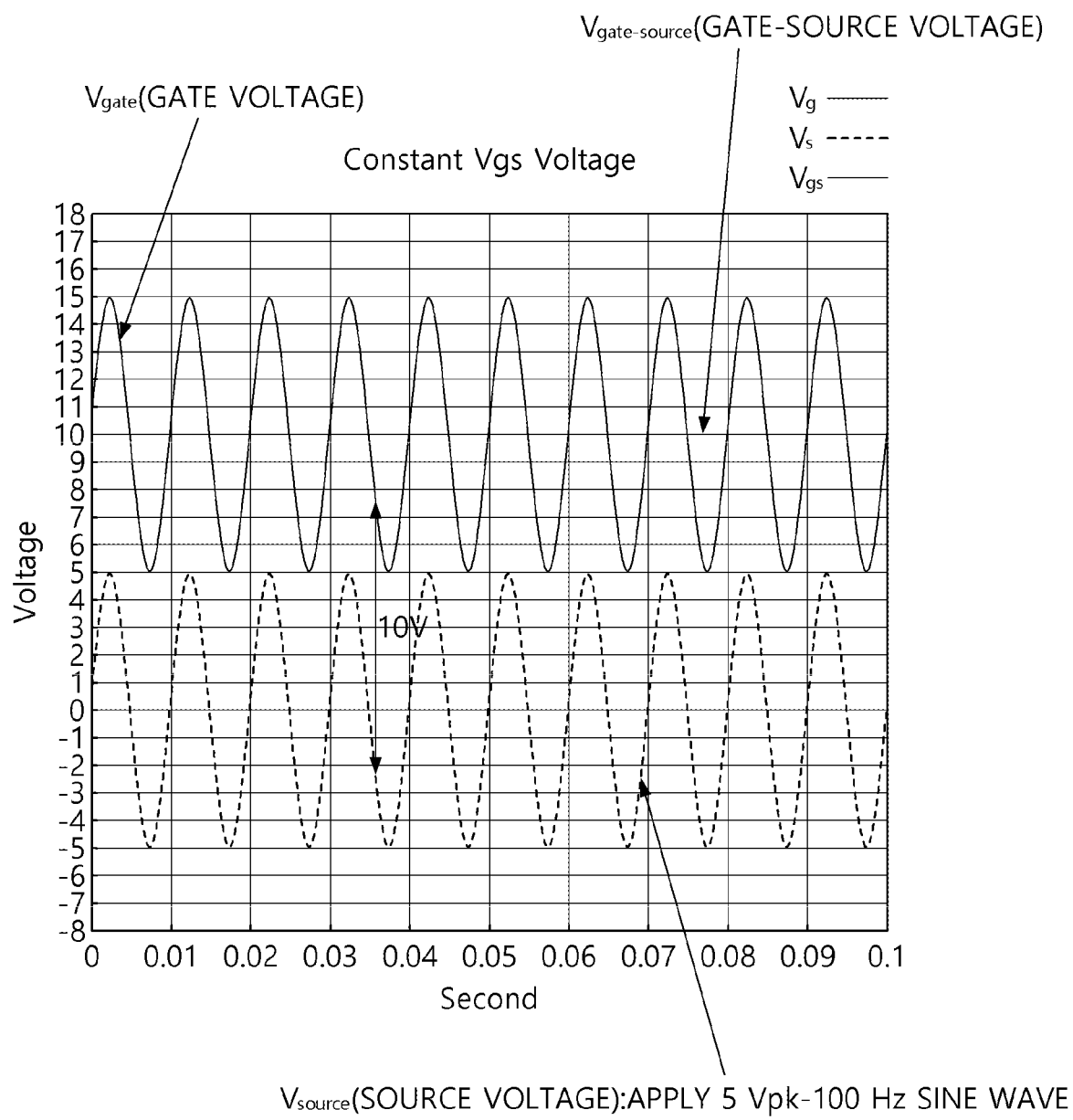

[FIG. 9]
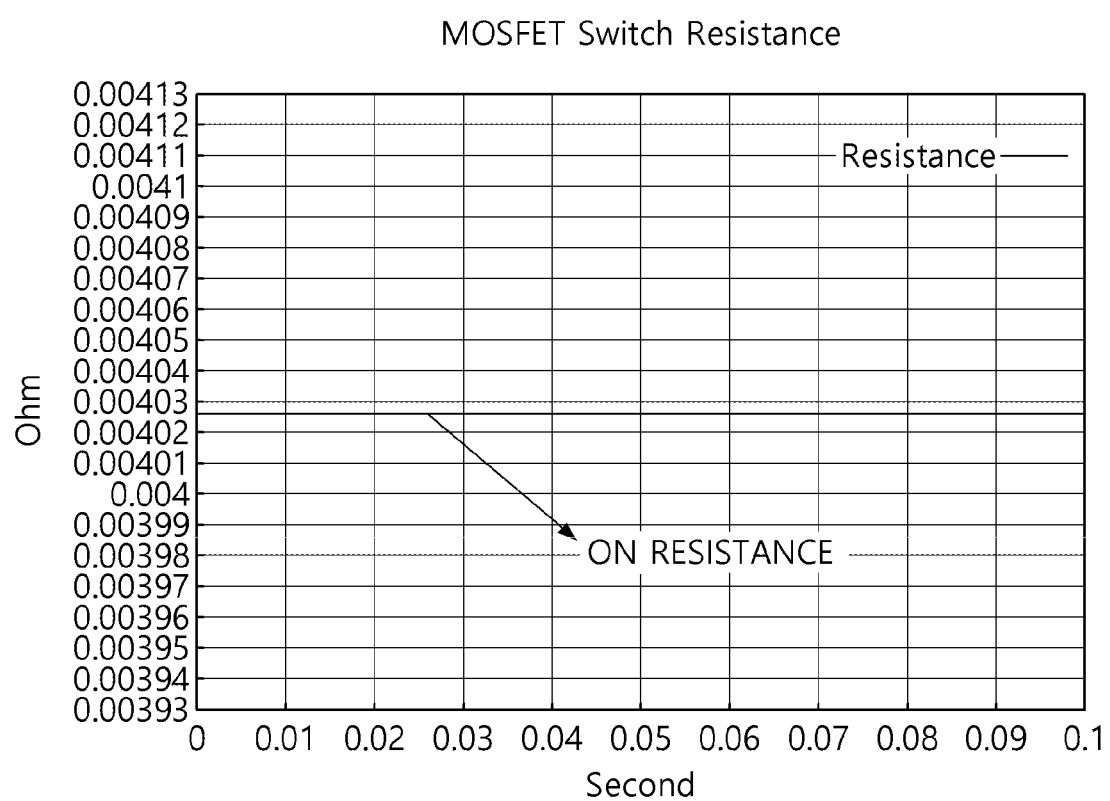

[FIG. 10]
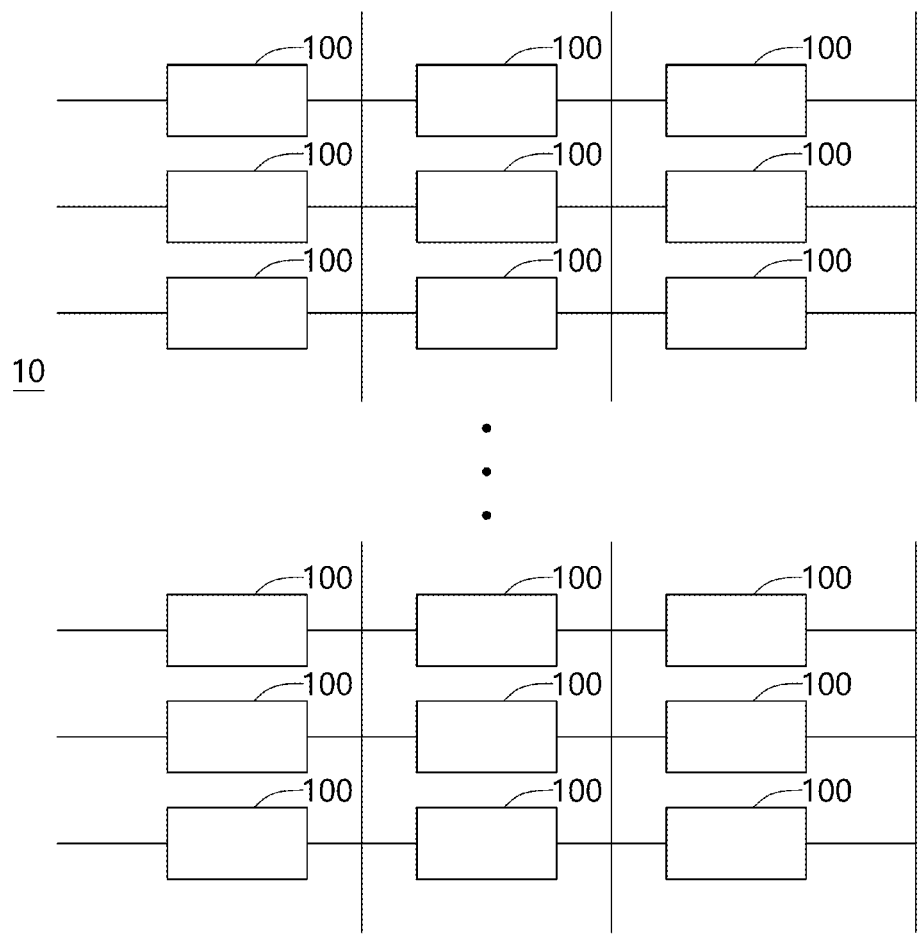

[FIG. 11]
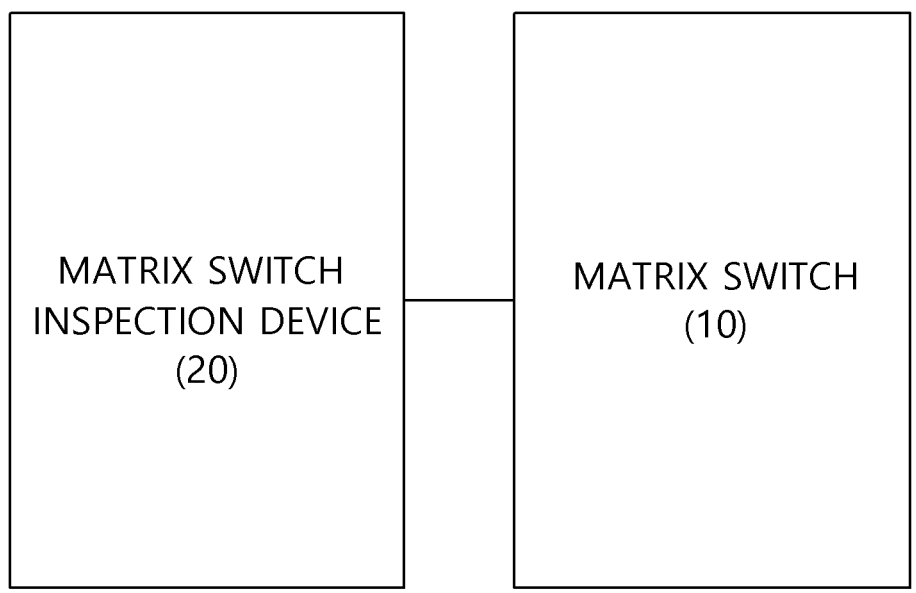

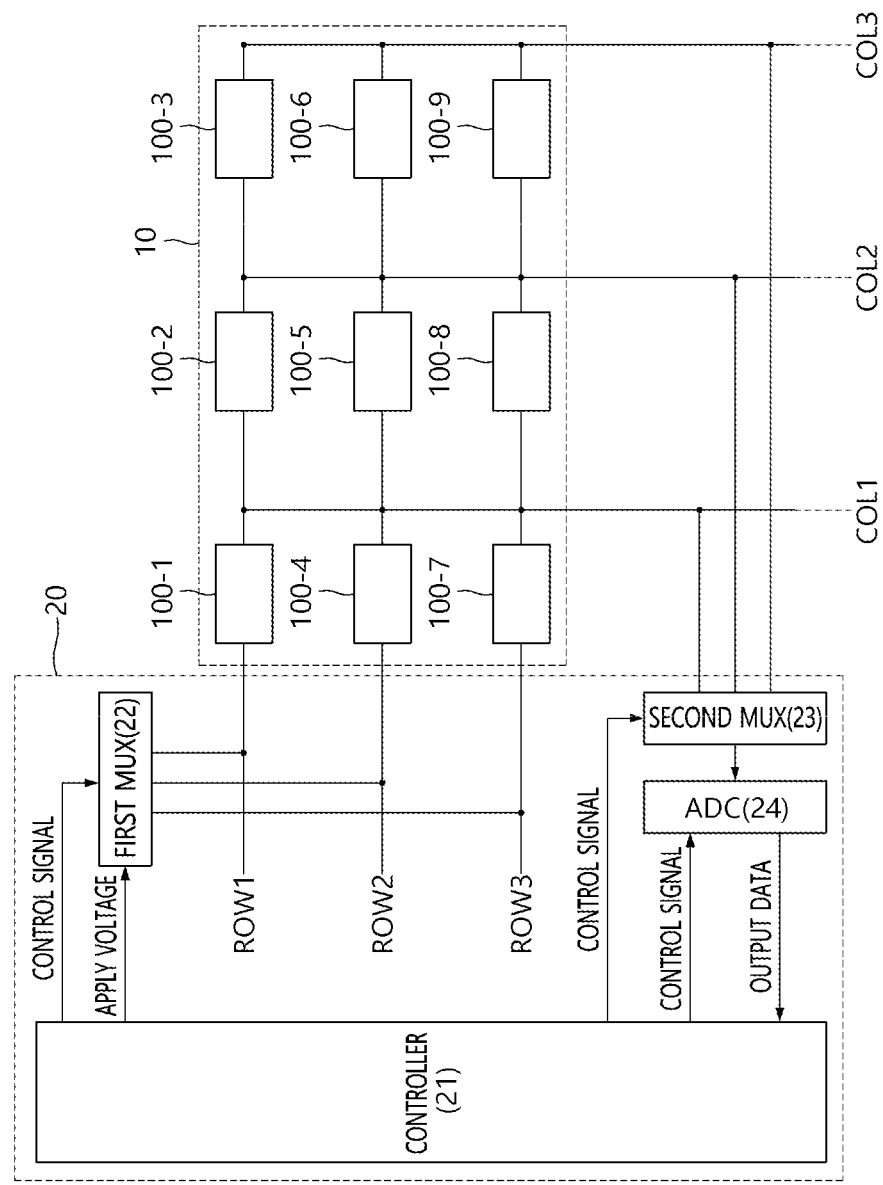
[FIG. 12]

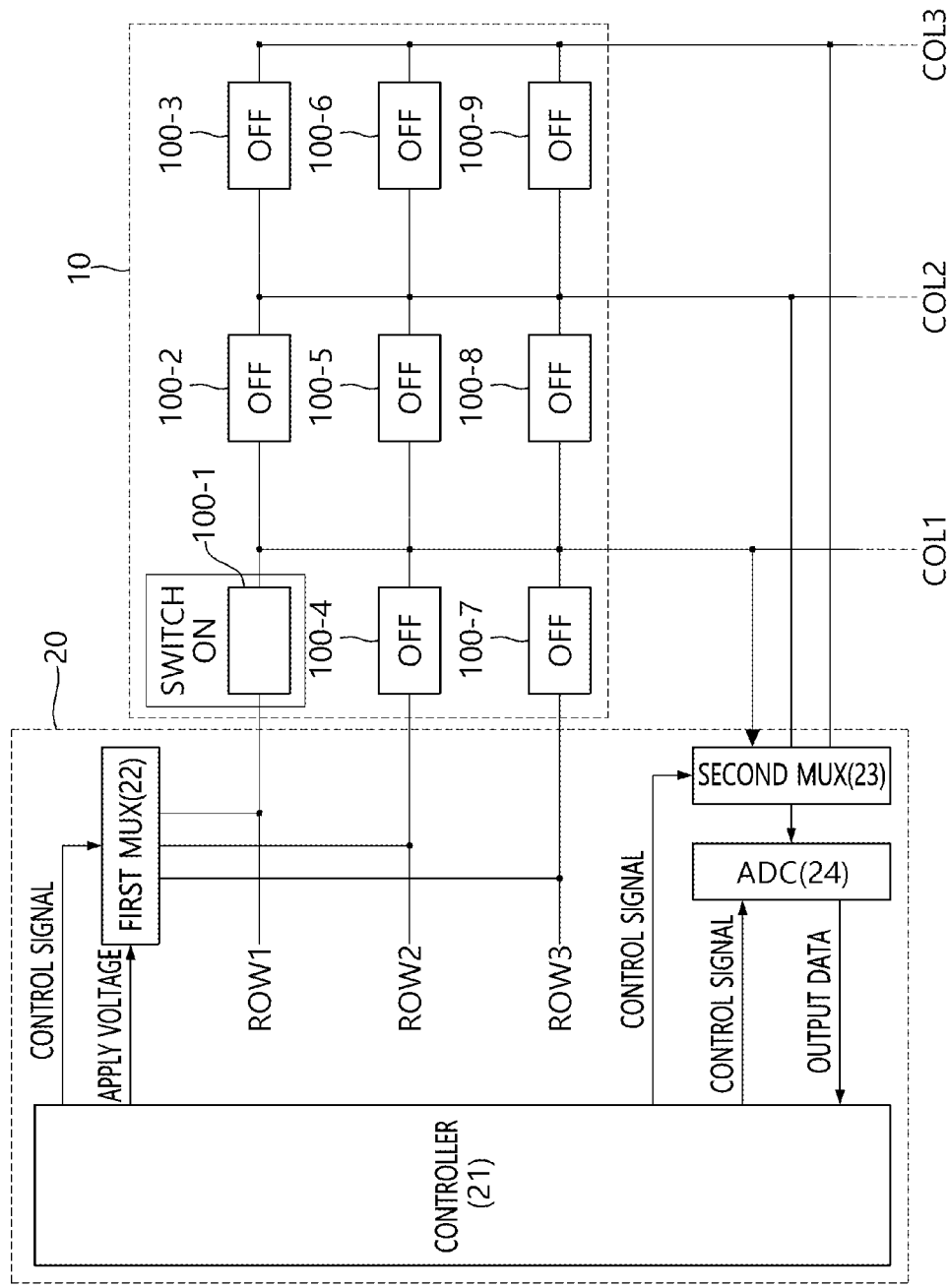
[FIG. 13]

SWITCHING CIRCUIT HAVING CONSTANT ON-RESISTANCE AND MATRIX SWITCH COMPRISING SAME

CROSS REFERENCE TO RELATED APPLICATIONS

The present application is a National Phase of International Application No. PCT/KR2022/008932 filed on Jun. 23, 2022, which claims the priority based on Korean Patent Application No. 10-2022-0028793 filed on Mar. 7, 2022, and the entire contents disclosed in the description and drawings of the corresponding applications are referenced in the present application.

BACKGROUND

Field

The present disclosure relates to a switching circuit and a matrix switch including the same, and more particularly, to a switching circuit having a constant ON-resistance and a matrix switch including the same.

Description of the Related Art

The contents described in this section merely provide background information on the present exemplary embodiment but do not constitute the related art.

A MOSFET has a unique resistance between a drain region and a source region, which is called an ON-resistance.

When the matrix switch of the related art is used to inspect a telemetry channel, a resistance of an element used for the switching is not accurate and constant so that there is a problem in that there is an error in a measured value.

For this reason, a matrix switch which uses a switching element with a low ON-resistance to maintain the linear resistance to be constant and low is necessary.

SUMMARY

An object to be achieved by the present disclosure is to provide a switching circuit which does not cause a problem due to a body-diode, operates as a bidirectional switch, and maintains a resistance (ON-resistance) between a drain region and a source region to be constant by adjusting a voltage of a gate region in accordance with a voltage change of the source region.

An object to be achieved by the present disclosure is to provide a matrix switch in which the ON-resistance does not vary according to a switching circuit block (row/column), the ON-resistance is constant regardless of the change in the number of channels, and the change in the ON-resistance is kept small even by the temperature change.

Other and further objects of the present disclosure which are not specifically described can be further considered within the scope easily deduced from the following detailed description and the effect.

In order to achieve the above-described objects, according to another aspect of the present disclosure, a switching circuit includes a first switching element; a second switching element which is electrically connected to the first switching element; and a voltage maintaining unit which maintains a first voltage difference between a gate region and a source region of the first switching element to be constant, maintains a second voltage difference between a gate region and a source region of the second switching element to be constant, and maintains the first voltage difference and the second voltage difference to be the same.

Here, the first switching element and the second switching element are electrically connected in series through two different nodes.

Here, a source region of the first switching element and a source region of the second switching element are electrically connected through a first node and a gate region of the first switching element and a gate region of the second switching element are electrically connected through a second node.

Here, the first switching element and the second switching element are N-type MOSFET elements.

Here, the voltage maintaining unit includes a signal reception terminal which receives a control signal for controlling an operation of the switching circuit; a first amplifier which receives the control signal received from the signal reception terminal through a plus (+) input terminal by means of a third node; and a second amplifier which is electrically connected to the first node through a plus (+) input terminal.

Here, the voltage maintaining unit further includes a fourth node which is electrically connected to a minus (−) input terminal of the first amplifier; a first impedance element which is electrically connected between the fourth node and a ground; a fifth node which is electrically connected to an output terminal of the first amplifier; and a second impedance element which is electrically connected between the fourth node and the fifth node.

Here, the voltage maintaining unit further includes a third impedance element which is electrically connected between the signal reception terminal and the third node; a sixth node which is electrically connected to an output terminal of the second amplifier; and a fourth impedance element which is electrically connected between the third node and the sixth node.

Here, in the second amplifier, the sixth node is electrically connected to a minus (−) input terminal of the second amplifier.

Here, in the voltage maintaining unit, a fifth impedance element which prevents the overshoot is electrically connected between the second node and the fifth node.

Here, an input port is electrically connected to a drain region of the first switching element and an output port is electrically connected to a drain region of the second switching element or the input port is electrically connected to the drain region of the second switching element and the output port is electrically connected to the drain region of the first switching element to operate as a bidirectional switch.

In order to achieve the above-described objects, according to another aspect of the present disclosure, a matrix switch is formed by a plurality of switching circuits and the plurality of switching circuits is disposed to form an array.

In order to achieve the above-described objects, a matrix switch inspection system according to an exemplary embodiment of the present disclosure includes a matrix switch formed by a plurality of switching circuits including a first switching element, a second switching element which is electrically connected to the first switching element, and a voltage maintaining unit which maintains a first voltage difference between a gate region and a source region of the first switching element to be constant, maintains a second voltage difference between a gate region and a source region of the second switching element to be constant, and maintains the first voltage difference and the second voltage difference to be the same, the switching circuits being disposed to form an array; and a matrix switch inspection device which inspects whether the switching circuit included in the matrix switch is defective.

Here, the matrix switch inspection device further includes: a controller which transmits a control signal including information about a switching circuit which is a target of defect inspection, among a plurality of switching circuits included in the matrix switch; a first MUX which applies a voltage to the switching circuit which is a target of defect inspection, in response to a control signal transmitted by the controller; a second MUX which receives a voltage output from a switching circuit which is a target of defect inspection; and an analog-digital converter which performs analog-digital conversion on a voltage received by the second MUX to generate data and transmits the generated data to the controller.

Here, the controller determines whether the switching circuit which is a target of defect inspection is defective based on data transmitted by the analog-digital converter.

Here, the matrix switch inspection device further includes: a switching circuit ON/OFF controller which receives a control signal transmitted by the controller to turn on a switching circuit which is a target of defect inspection and turn off a switching circuit which is not a target of defect inspection, among a plurality of switching circuits included in the matrix switch.

As described above, according to an exemplary embodiment of the present disclosure, a switching circuit is applied so as not to cause a problem due to a body-diode, operates as a bidirectional switch, and maintains a resistance (ON-resistance) between a drain region and a source region to be constant by adjusting a voltage of a gate region in accordance with a voltage change of the source region.

Further, according to an exemplary embodiment of the present disclosure, a matrix switch is applied so that there is no difference in the ON-resistance according to the switching circuit block (row/column), even though the number of channels is changed, the ON-resistance is constant, and even though the temperature changes, the change in the ON-resistance is kept small.

Even if the effects are not explicitly mentioned here, the effects described in the following specification which are expected by the technical features of the present disclosure and their potential effects are handled as described in the specification of the present disclosure.

BRIEF DESCRIPTION OF DRAWINGS

FIG. 1 is a block diagram schematically illustrating a configuration of a switching circuit according to an exemplary embodiment of the present disclosure;

FIG. 2 is a view for describing a body diode generated in an N-type MOSFET;

FIG. 3 is a view for describing an electrical connection structure of a first switching element and a second switching element according to an exemplary embodiment of the present disclosure to solve the problem described in FIG. 2;

FIG. 4, FIG. 5, and FIG. 6 are views for describing a voltage maintaining unit according to an exemplary embodiment of the present disclosure;

FIG. 7 is a view for describing an electrical connection structure of a switching circuit according to an exemplary embodiment of the present disclosure in detail;

FIG. 8 is a graph for describing an effect of a voltage maintaining unit according to an exemplary embodiment of the present disclosure;

FIG. 9 is a graph for describing an effect of a switching circuit according to an exemplary embodiment of the present disclosure;

FIG. 10 is a view for describing a matrix switch according to an exemplary embodiment of the present disclosure;

FIG. 11 is a block diagram schematically illustrating a matrix switch inspection system according to an exemplary embodiment of the present disclosure;

FIG. 12 is a block diagram illustrating a matrix switch inspection system according to an exemplary embodiment of the present disclosure in detail; and FIG. 13 is a view for describing an operating process of a matrix switch inspection system according to an exemplary embodiment of the present disclosure.

DETAILED DESCRIPTION OF THE PREFERRED EMBODIMENT

Hereinafter, embodiments of the present disclosure will be described in detail with reference to the accompanying drawings. Advantages and characteristics of the present disclosure and a method of achieving the advantages and characteristics will be clear by referring to exemplary embodiments described below in detail together with the accompanying drawings. However, the present disclosure is not limited to exemplary embodiments disclosed herein but will be implemented in various different forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims. Unless otherwise defined, all terms (including technical and scientific terms) used in the present specification may be used as the meaning which may be commonly understood by the person with ordinary skill in the art, to which the present disclosure belongs. It will be further understood that terms defined in commonly used dictionaries should not be interpreted in an idealized or excessive sense unless expressly and specifically defined.

Terms used in the present application are just used to describe a specific exemplary embodiment and do not intend to limit the present disclosure and a singular expression may include a plural expression as long as it is not apparently contextually different. In the present application, it should be understood that term "have" "may have", "include" or "may include" indicates that a feature, a number, a step, an operation, a component, a part or a combination thereof described in the specification is present, but do not exclude a possibility of presence or addition of one or more other features, numbers, steps, operations, components, parts or combinations thereof, in advance. Terms including an ordinary number, such as first and second, are used for describing various constituent elements, but the constituent elements are not limited by the terms.

The above terms are used only to distinguish one component from the other component. For example, without departing from the scope of the present invention, a first component may be referred to as a second component, and similarly, a second component may be referred to as a first component. A term of and/or includes combination of a plurality of related elements or any one of the plurality of related elements.

In the present specification, in each step, numerical symbols (for example, a, b, and c) are used for the convenience of description, but do not explain the order of the steps so that unless the context apparently indicates a specific order, the order may be different from the order described in the specification. That is, the steps may be performed in the order as described or simultaneously, or an opposite order.

The term "~unit" used in the specification refers to a software or hardware component such as a field programmable gate array (FPGA) or an ASIC and "~unit" performs some functions. However, "~unit" is not limited to the software or the hardware. "~unit" may be configured to be in an addressable storage medium or may be configured to reproduce one or more processors. Accordingly, as an example, "~unit" includes components such as software components, object oriented software components, class components, and task components, processes, functions, attributes, procedures, subroutines, segments of a program code, drivers, a firmware, a microcode, a circuit, data, database, and data structures. A function which is provided in the components and "~units" may be combined with a smaller number of components and "~units" or divided into additional components and "~units".

Hereinafter, various exemplary embodiments of a switching circuit with a constant ON-resistance according to the present disclosure and a matrix switch including the same will be described with reference to the accompanying drawings.

The exemplary embodiments described in the present specification may be applied to a temperature sensor (for example, a resistance temperature detector (RTD) temperature sensor, specifically, a 3-wire RTD temperature sensor).

FIG. 1 is a block diagram schematically illustrating a configuration of a switching circuit according to an exemplary embodiment of the present disclosure.

Referring to FIG. 1, a switching circuit 100 includes a first switching element 1100, a second switching element 1200, and a voltage maintaining unit 1300.

The first switching element 1100 may be an N-type MOSFET.

The second switching element 1200 may be electrically connected to the first switching element 1100. The second switching element 1200 may be an N-type MOSFET.

The first switching element 1100 and the second switching element 1200 may be electrically connected in series through two different nodes.

The voltage maintaining unit 1300 may maintain a first voltage difference between a gate region and a source region of the first switching element 1100 to be constant. The voltage maintaining unit 1300 may maintain a second voltage difference between a gate region and a source region of the second switching element 1200 to be constant. The voltage maintaining unit 1300 may maintain the first voltage difference and the second voltage difference to be the same.

All the blocks illustrated in FIG. 1 are not essential configurations, and some blocks connected to the switching circuit 100 in another exemplary embodiment may be added, changed, and deleted.

FIG. 2 is a view for explaining a body diode generated in an N-type MOSFET.

The N-type MOSFET uses a P type substrate and drain and source terminals are N-type doped. A P-N junction is caused by this structure so that a parasitic diode called a body-diode is generated. When a voltage which is equal to or higher than a threshold is applied to $V_{GATE-SOURCE}$, a channel between a drain and a source is formed so that the body-diode is not a problem, but when the voltage is not applied, that is, when the MOSFET is turned off, the current may flow from the source to the drain through the body-diode.

There is no problem if a circuit is designed to always flow current from the drain to the source, but there may be a problem in a circuit in which the current flows from the source to the drain.

In order to solve the above-described problems and allow the MOSFET to operate as a bidirectional switch, various exemplary embodiments of the present disclosure apply a back-to-back MOSFET structure by electrically connecting the first switching element 1100 and the second switching element 1200.

FIG. 3 is a view for describing an electrical connection structure of a first switching element and a second switching element according to an exemplary embodiment of the present disclosure to solve the problem described in FIG. 2.

Referring to FIG. 3, a source region of the first switching element 1100 and a source region of the second switching element 1200 may be electrically connected through the first node 1111.

A gate region of the first switching element 1100 and a gate region of the second switching element 1200 may be electrically connected to each other through a second node 1112.

The back-to-back MOSFET structure may be formed by connecting gates and source terminals of two N-type MOSFETs as illustrated in FIG. 3. With this connection, one $V_{GATE-SOURCE}$ is applied to simultaneously turn on/off two MOSFETS and when the MOSFETs are turned off, directions of the body-diodes are opposite so that no current may flow or a very small amount of current may flow.

FIGS. 4 to 6 are views for describing a voltage maintaining unit according to an exemplary embodiment of the present disclosure.

The MOSFET has an ON-resistance RDS (ON) which is a unique resistance between the drain region and the source region. The smaller the ON-resistance RDS(ON) of the MOSFET, the smaller the power loss and the effect on the circuit.

The ON-resistance of the N-type MOSFET may vary depending on $V_{GATE-SOURCE}$.

However, there is a problem in that $V_{GATE-SOURCE}$ Changes depending on a voltage applied to the drain region of the MOSFET, so that a magnitude of the ON-resistance changes. That is, if the matrix switch is implemented as a back-to-back MOSFET as illustrated in FIG. 3, a magnitude of the ON-resistance changes depending on an input voltage, so that there is a problem in that it does not operate as a matrix switch having a constant voltage always.

Further, when 0 V is applied to the gate region and −3 V is applied to the drain region, $V_{GATE-SOURCE}$ is approximately 2.7955 V so that there is a problem in that the MOSFET is not turned off, but weakly turned on so that unintentional current flows. Therefore, the voltage maintaining unit 1300 which always maintains constant V GATE-SOURCE by flexibly changing a voltage applied to the gate region in accordance with a voltage of the source region is designed as illustrated in FIG. 4.

The voltage maintaining unit 1300 may be a summing amplifier circuit, and specifically, includes a non-inverting summing amplifier circuit.

In order to describe the operation of the voltage maintaining unit 1300, an operating method of the summing amplifier circuit will be described below.

The non-inverting summing amplifier circuit illustrated in FIG. 4 may be analyzed using the principle of superposition. First, when it is assumed that $V_{j2}=0$ to calculate $V_{o1}$, it is illustrated in FIG. 5.

The following Equation 1 is an equation to calculate $V_{o1}$.

$$V_+ = V_{I1} \times \left(\frac{R_2}{R_1 + R_2}\right)$$ [Equation 1]

$$V_{O1} = V_+ \times \left(1 + \frac{R_F}{R_A}\right)$$

$$V_{O1} = V_{I1} \times \left(\frac{R_2}{R_1 + R_2}\right) \times \left(1 + \frac{R_F}{R_A}\right)$$

When it is assumed that $V_{o1}=0$ to calculate $V_{o2}$ by the above-mentioned method, it is illustrated in FIG. 6.

The following Equation 2 is an equation to calculate $V_{o2}$.

$$V_+ = V_{I2} \times \left(\frac{R_1}{R_1 + R_2}\right)$$ [Equation 2]

$$V_{O2} = V_+ \times \left(1 + \frac{R_F}{R_A}\right)$$

$$V_{O2} = V_{I2} \times \left(\frac{R_1}{R_1 + R_2}\right) \times \left(1 + \frac{R_F}{R_A}\right)$$

The following Equation 3 is to finally calculate $V_o$ using Equations 1 and 2.

$$V_O =$$ [Equation 3]

$$V_{O1} + V_{O2} = \left(1 + \frac{R_F}{R_A}\right) \times \left\{V_{I1} \times \left(\frac{R_2}{R_1 + R_2}\right) + V_{I2} \times \left(\frac{R_1}{R_1 + R_2}\right)\right\}$$

When it is assumed that $V_o$ is $V_{GATE}$ which is a voltage applied to the gate region, $V_{I2}$ is a voltage $V_{SOURCE}$ applied to the source region, $R_A$ is 1 kΩ, $R_F$ is 2 kΩ, $R_1$ is 1 kΩ, $R_2$ is 2 kΩ, and an input voltage of 5 V is applied to $V_{I1}$, the following Equation 4 is obtained.

$$V_{GATE} = \left(1 + \frac{2K}{1K}\right) \times \left\{5V \times \left(\frac{2K}{1K + 2K}\right) + V_{SOURCE} \times \left(\frac{1K}{1K + 2K}\right)\right\}$$ [Equation 4]

$$= 3 \times \left\{\frac{10}{3} + \frac{V_{SOURCE}}{3}\right\}$$

$$= 10 + V_{SOURCE}$$

$$V_{GATE} - V_{SOURCE} = 10$$

That is, when it is assumed that $R_A$ is 1 kΩ, RE is 2 kΩ, $R_1$ is 1 kΩ, $R_2$ is 2 kΩ, and an input voltage of 5 V is applied to $V_{I1}$, $V_{GATE-SOURCE}$ always maintains 10 V. However, the OP amplifier cannot output more than the supplied voltage, so that when 20 V is applied to V+ and −7 V is supplied to V−, a range of the voltage to be applied to matrix switch input/output may be approximately 9 V to −16 V.

FIG. 7 is a view for describing an electrical connection structure of a switching circuit according to an exemplary embodiment of the present disclosure in detail.

The voltage maintaining unit 1300 may be implemented to include a signal reception terminal which receives a control signal for controlling an operation of the switching circuit 100, a first amplifier 1311 which receives a control signal received from the signal reception terminal through a plus (+) input terminal via a third node 1323, and a second amplifier 1312 which is electrically connected to a first node 1111 through the plus (+) input terminal.

Here, the voltage maintaining unit 1300 may be implemented to further include a fourth node 1324 which is electrically connected to a minus (−) input terminal of the first amplifier 1311 and a first impedance element 1331 which is electrically connected between the fourth node 1324 and a ground.

Here, the voltage maintaining unit 1300 may be implemented to further include a fifth node 1325 which is electrically connected to an output terminal of the first amplifier 1311 and a second impedance element 1332 which is electrically connected between the fourth node 1324 and the fifth node 1325.

Here, the voltage maintaining unit 1300 may be implemented to further include a third impedance element 1333 which is electrically connected between the signal reception terminal and the third node 1323.

Here, the voltage maintaining unit 1300 may be implemented to further include a sixth node 1326 which is electrically connected to an output terminal of the second amplifier 1312 and a fourth impedance element 1324 which is electrically connected between the third node 1323 and the sixth node 1326.

Here, the second amplifier 1312 is implemented such that the sixth node 1326 is electrically connected to the minus (−) input terminal of the second amplifier 1312.

Here, the voltage maintaining unit 1300 may be implemented such that a fifth impedance element 1325 for preventing the overshoot is electrically connected between the second node 1322 and the fifth node 1325.

Here, the first impedance element 1321, the second impedance element 1322, the third impedance element 1323, the fourth impedance element 1324, and the fifth impedance element 1325 are resistive elements.

The first switching element 1100 and the second switching element 1200 are connected in the form of the back-to-back MOSFET to form a bidirectional switch structure. Therefore, an input port is electrically connected to the drain region of the first switching element 1100 and an output port is electrically connected to the drain region of the second switching element 1200. In contrast, the input port is electrically connected to the drain region of the second switching element 1200 and the output port is electrically connected to the drain region of the first switching element 1100.

FIG. 8 is a graph for explaining an effect of a voltage maintaining unit according to an exemplary embodiment of the present disclosure.

FIG. 8 is a graph obtained by measuring $V_{GATE}$ by applying a voltage of 5 V to a circuit input of the voltage maintaining unit 1300 and applying a sine wave of 5 Vpk and 100 Hz to $V_{SOURCE}$ to turn on the MOSFET and identifying $V_{GATE-SOURCE}$.

Referring to FIG. 8, when 5 V is applied, $V_{GATE}$ changes in response to the sine wave of 5 Vpk and 100 Hz applied to $V_{SOURCE}$ and $V_{GATE-SOURCE}$ is always constant to be 10 V.

When a voltage of 0 V is applied to the circuit input of the voltage maintaining unit 1300, similarly, $V_{GATE}$ changes so that $V_{GATE-SOURCE}$ always maintains a value close to 0 V.

FIG. 9 is a graph for describing an effect of a switching circuit according to an exemplary embodiment of the present disclosure.

When the first switching element 1100 and the second switching element 1200 are connected in a back-to-back MOSFET type, a sine wave of 5 Vpk and 100 Hz is applied to the drain region, and ON-resistance of the switching circuit 100 is checked, it is confirmed that $V_{GATE-SOURCE}$ is always constant to be 10 V so that the ON-resistance has a constant value of approximately 4.0262 mΩ.

Further, when the MOSFET is off, $V_{GATE\text{-}SOURCE}$ has a value which is approximate to 0 V and the OFF resistance has a significantly high resistance (OPEN) because the MOSFET is off.

FIG. 10 is a view for describing a matrix switch according to an exemplary embodiment of the present disclosure.

The matrix switch 10 according to various exemplary embodiments of the present disclosure is configured by a plurality of switching circuits 100 described above and the plurality of switching circuits 100 is disposed to form an array.

Referring to FIG. 10, the matrix switch 10 is used to be connected to a 3-wire sensor using three input/output ports which are disposed in a horizontal direction of FIG. 10. The matrix switch 10 is used to be connected to a multi-channel 3-wire type RTD measurement bridge circuit using three input/output ports disposed in the horizontal direction of FIG. 10.

A connection structure of the matrix switch 10 is as illustrated in FIG. 10, but is not limited thereto. The matrix switch 10 is implemented to control an input/output path by turning on/off a desired switching circuit 100. A row/column of the matrix switch 10 is extendable.

All the blocks illustrated in FIG. 10 are not essential configurations, and some blocks connected to the matrix switch 10 in another exemplary embodiment may be added, changed, and deleted.

FIG. 11 is a block diagram schematically illustrating a matrix switch inspection system according to an exemplary embodiment of the present disclosure.

A matrix switch inspection system 1 according to an exemplary embodiment of the present disclosure includes a matrix switch 10 and a matrix switch inspection device 20.

The matrix switch inspection device 20 is mounted in mechanical equipment which loads the matrix stich 10, together with the matrix switch 10, to perform a built-in self-test. The built-in self-test which is performed by the matrix switch inspection device 20 is to test whether there is a defect in each of the plurality of switching circuits 100 included in the matrix switch 10.

The matrix switch inspection device 20 will be described in more detail in FIG. 12.

All the blocks illustrated in FIG. 11 are not essential configurations, and some blocks connected to the matrix switch inspection system 1 in another exemplary embodiment may be added, changed, and deleted.

FIG. 12 is a block diagram for describing a matrix switch inspection system according to an exemplary embodiment of the present disclosure in detail.

The matrix switch inspection device 20 includes a controller 21, a first MUX 22, a second MUX 23, and an analog-digital converter (ADC) 24.

The controller 21 performs UART (universal asynchronous receiver/transmitter) communication with an external PC (not illustrated) outside the matrix switching inspection system 1 to control a matrix inspection process which is performed by the matrix switch inspection device 20. The controller 21 transmits a control signal to the first MUX 22. The controller 21 applies a voltage (for example, 3.3 V) to the first MUX 22.

The controller 21 controls the first MUX 22 by means of a control signal to diagnose the defects of all the switching circuits included in the matrix switch 10. When the control unit 21 does not diagnose the defect, it does not affect the operation of the matrix switch.

The control signal includes information of a switching circuit 100 to be tested (for example, referring to FIG. 12, an instruction to test a circuit denoted by reference numeral 100-4, among nine switching circuits 100).

According to the exemplary embodiment of the present disclosure, the controller 21 transmits and receives data to and from the PC using the UART (universal asynchronous receiver/transmitter).

The first MUX 22 applies a voltage received from the controller 21 to a switching circuit 100 to be tested, in response to the control signal received from the controller 21.

The first MUX 22 may be a 1:N MUX.

The second MUX 23 transmits a voltage output from the switching circuit 100 which is applied with a voltage from the controller 21 to the analog-digital converter (ADC) 24.

The second MUX 23 may be an N:1 MUX.

The analog-digital converter (ADC) 24 checks a voltage received from the MUX 23 to perform the analog-digital conversion and transmits converted digital data to the controller 21.

Next, the controller 21 receives and checks data output by the analog-digital converter 24 and determines whether the switching circuit 100 to be tested is defective.

For example, data received by the controller 21 is 0 V or a value approximate to 0 V (for example, 0 to 0.7 V), the controller 21 determines that the switching circuit 100 is defective.

In contrast, when the data received by the controller 21 is a value equal to a voltage applied to the first MUX 22 by the controller 21 or an approximate value thereto (for example, a value corresponding to 0.9 times the applied value to an applied value), the controller 21 determines that the switching circuit 100 is normally operable.

All the blocks illustrated in FIG. 12 are not essential configurations, and some blocks connected to the matrix switch inspection system 1 in another exemplary embodiment may be added, changed, and deleted.

FIG. 13 is a view for describing an operating process of a matrix switch inspection system according to an exemplary embodiment of the present disclosure.

According to another exemplary embodiment of the present disclosure, the matrix switch inspection device 20 may further include a switching circuit ON/OFF controller (not illustrated).

The switching circuit ON/OFF controller receives a control signal from the controller 21 to turn on only a switching circuit to be tested and turn off the remaining switching circuits.

Referring to FIG. 13, the controller 21 controls to test a switching circuit 100-1 denoted by the reference numeral 100-1 in response to an instruction received by means of the communication between the PC and the matrix switch inspection device 20.

The switching circuit ON/OFF controller turns on the switching circuit 100-1 to be tested and turns off all the remaining switching circuits 100-2, 100-3, 100-4, 100-5, 100-6, 100-7, 100-8, and 100-9, in response to the control signal received from the controller 21.

The first MUX 22 applies a voltage received from the controller 21 to the switching circuit 100-1 to be tested, in response to the control signal received from the controller 21.

The second MUX 23 transmits a voltage output from the switching circuit 100-1 which is applied with a voltage from the controller 21 to the analog-digital converter (ADC) 24.

The analog-digital converter (ADC) 24 checks a voltage received from the MUX 23 to perform the analog-digital conversion and transmits converted digital data to the controller 21.

Next, the controller 21 receives and checks data output by the analog-digital converter 24 and determines whether the switching circuit 100 to be tested is defective.

Even though it has been described above that all components of the exemplary embodiment of the present invention are combined as one component or operate to be combined, the present invention is not limited to the exemplary embodiment. In other words, one or more components may be selectively combined to be operated within a scope of the present invention. Further, all components may be implemented as one independent hardware but a part or all of the components are selectively combined to be implemented as a computer program which includes a program module which performs a part or all functions combined in one or plural hardwares. Further, such a computer program may be stored in a computer readable media such as a USB memory, a CD disk, or a flash memory to be read and executed by a computer to implement the exemplary embodiment of the present invention. The recording media of the computer program may include a magnetic recording medium or an optical recording medium.

The above description illustrates a technical spirit of the present invention as an example and various changes, modifications, and substitutions become apparent to those skilled in the art within a scope of an essential characteristic of the present invention. Therefore, as is evident from the foregoing description, the exemplary embodiments and accompanying drawings disclosed in the present invention do not limit the technical spirit of the present invention and the scope of the technical spirit is not limited by the exemplary embodiments and accompanying drawings. The protection scope of the present invention should be interpreted based on the following appended claims and it should be appreciated that all technical spirits included within a range equivalent thereto are included in the scope of the present invention.

What is claimed is:

1. A switching circuit, comprising:
   a first switching element;
   a second switching element which is electrically connected to the first switching element; and
   a voltage maintaining unit which maintains a first voltage difference between a gate region and a source region of the first switching element to be constant, maintains a second voltage difference between a gate region and a source region of the second switching element to be constant, and maintains the first voltage difference and the second voltage difference to be the same.

2. The switching circuit according to claim 1, wherein the first switching element and the second switching element are electrically connected in series through two different nodes.

3. The switching circuit according to claim 2, wherein a source region of the first switching element and a source region of the second switching element are electrically connected through a first node and a gate region of the first switching element and a gate region of the second switching element are electrically connected through a second node.

4. The switching circuit according to claim 3, wherein the first switching element and the second switching element are N-type MOSFET elements.

5. The switching circuit according to claim 4, wherein the voltage maintaining unit includes:
   a signal reception terminal which receives a control signal for controlling an operation of the switching circuit;
   a first amplifier which receives the control signal received from the signal reception terminal through a plus (+) input terminal by means of a third node; and
   a second amplifier which is electrically connected to the first node through a plus (+) input terminal.

6. The switching circuit according to claim 5, wherein the voltage maintaining unit further includes:
   a fourth node which is electrically connected to a minus (−) input terminal of the first amplifier;
   a first impedance element which is electrically connected between the fourth node and a ground;
   a fifth node which is electrically connected to an output terminal of the first amplifier; and
   a second impedance element which is electrically connected between the fourth node and the fifth node.

7. The switching circuit according to claim 6, wherein the voltage maintaining unit further includes:
   a third impedance element which is electrically connected between the signal reception terminal and the third node;
   a sixth node which is electrically connected to an output terminal of the second amplifier; and
   a fourth impedance element which is electrically connected between the third node and the sixth node.

8. The switching circuit according to claim 7, wherein in the second amplifier, the sixth node is electrically connected to a minus (−) input terminal of the second amplifier.

9. The switching circuit according to claim 8, wherein in the voltage maintaining unit, a fifth impedance element which prevents the overshoot is electrically connected between the second node and the fifth node.

10. The switching circuit according to claim 1, wherein an input port is electrically connected to a drain region of the first switching element and an output port is electrically connected to a drain region of the second switching element or the input port is electrically connected to the drain region of the second switching element and the output port is electrically connected to the drain region of the first switching element to operate as a bidirectional switch.

11. A matrix switch which is formed by a plurality of switching circuits according to claim 1, wherein the plurality of switching circuits is disposed to form an array.

12. A matrix switch inspection system, comprising:
   a matrix switch formed by a plurality of switching circuits including a first switching element, a second switching element which is electrically connected to the first switching element, and a voltage maintaining unit which maintains a first voltage difference between a gate region and a source region of the first switching element to be constant, maintains a second voltage difference between a gate region and a source region of the second switching element to be constant, and maintains the first voltage difference and the second voltage difference to be the same, the switching circuits being disposed to form an array; and
   a matrix switch inspection device which inspects whether the switching circuit included in the matrix switch is defective.

13. The matrix switch inspection system according to claim 12, wherein the matrix switch inspection device includes:
   a controller which transmits a control signal including information about a switching circuit which is a target of defect inspection, among a plurality of switching circuits included in the matrix switch;
a first MUX which applies a voltage to the switching circuit which is a target of defect inspection, in response to a control signal transmitted by the controller;
a second MUX which receives a voltage output from a switching circuit which is a target of defect inspection; and
an analog-digital converter which performs analog-digital conversion on a voltage received by the second MUX to generate data and transmits the generated data to the controller.

14. The matrix switch inspection system according to claim 13, wherein the controller determines whether the switching circuit which is a target of defect inspection is defective based on data transmitted by the analog-digital converter.

15. The matrix switch inspection system according to claim 13, wherein the matrix switch inspection device further includes:
a switching circuit ON/OFF controller which receives a control signal transmitted by the controller to turn on a switching circuit which is a target of defect inspection and turn off a switching circuit which is not a target of defect inspection, among a plurality of switching circuits included in the matrix switch.

* * * * *